(12) United States Patent
Aram

(10) Patent No.: US 8,049,566 B1
(45) Date of Patent: Nov. 1, 2011

(54) FEEDBACK LNA WITH RESISTOR

(75) Inventor: Farbod Aram, Los Altos Hills, CA (US)

(73) Assignee: Project FT, Inc., Mountain View, CA (US)

( * ) Notice: Subject to any disclaimer, the term of this patent is extended or adjusted under 35 U.S.C. 154(b) by 705 days.

(21) Appl. No.: 12/231,170

(22) Filed: Aug. 29, 2008

Related U.S. Application Data

(63) Continuation of application No. 11/904,604, filed on Sep. 26, 2007, now Pat. No. 7,764,124.

(60) Provisional application No. 60/827,033, filed on Sep. 26, 2006.

(51) Int. Cl.
*H03F 3/04* (2006.01)
(52) U.S. Cl. ............ 330/305; 330/282; 330/99; 330/100
(58) Field of Classification Search ................. 330/305, 330/282, 99, 100
See application file for complete search history.

(56) References Cited

U.S. PATENT DOCUMENTS

| | | | |
|---|---|---|---|
| 7,109,793 B2 * | 9/2006 | Nakatani et al. | 330/252 |
| 7,323,930 B2 | 1/2008 | Aram et al. | |
| 7,529,529 B2 * | 5/2009 | Taylor | 455/130 |
| 7,672,659 B2 * | 3/2010 | Mattisson | 455/323 |
| 7,826,816 B2 * | 11/2010 | Zhuo et al. | 455/315 |
| 7,885,626 B2 * | 2/2011 | Tanaka et al. | 455/234.1 |
| 7,949,322 B2 * | 5/2011 | Kim et al. | 455/248.1 |

* cited by examiner

*Primary Examiner* — Patricia Nguyen
(74) *Attorney, Agent, or Firm* — Van Pelt, Yi & James LLP

(57) ABSTRACT

A receiver includes a feedback low noise amplifier (LNA). The feedback LNA has an LNA gain and includes an LNA input configured to receive a signal from an antenna and an LNA output configured to output an amplified voltage signal. The receiver also includes a resistive element, having a resistance, coupled to the LNA output and configured to convert the amplified voltage signal into a current. The receiver also includes a current commuting mixer coupled to the resistive element and configured to receive the current from the resistive element, where the current output by the resistive element is determined at least in part by the amplified voltage signal and the resistance of the resistive element.

20 Claims, 6 Drawing Sheets

FEEDBACK LNA WITH RESISTOR

CROSS REFERENCE TO OTHER APPLICATIONS

This application is a continuation in part of U.S. patent application Ser. No. 11/904,604 (U.S. Publication No. 2008/0079494) entitled BROADBAND LOW NOISE AMPLIFIER filed Sep. 26, 2007 now U.S. Pat. No. 7,764,124, which is incorporated herein by reference for all purposes, which claims priority to U.S. Provisional Patent Application No. 60/827,033 entitled METHOD AND SYSTEM FOR TUNED CMOS LOW NOISE AMPLIFIER filed Sep. 26, 2006, which is incorporated herein by reference for all purposes.

BACKGROUND OF THE INVENTION

Low noise amplifiers (LNA) are commonly used in front end receivers. An LNA is designed to have certain properties, such as an input resistance that matches an antenna, a certain gain (e.g., 10 to 20 dB), low noise, good linearity, etc. Front end receivers also have a mixer that mixes a received signal with an oscillating signal. A current commuting mixer inputs a current, whereas an LNA outputs a voltage. To convert from voltage to current, some front end receivers use transconductors between the LNA and mixer. Although transconductors have their advantages, one disadvantage to using a transconductor is that it consumes power since transconductors include transistors which must be biased. Also, the transconductor must be designed so that certain properties (e.g., linearity) are acceptable. It would be desirable if new LNA circuits could be designed that consume less power and/or and have better linearity. Furthermore, it would be desirable if these LNA circuits were broadband and/or could be configured to operate at a selected frequency of interest.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A receiver is disclosed herein which includes a feedback low noise amplifier (LNA), a resistor, and a current commuting mixer. The LNA outputs an amplified voltage signal. The resistor is coupled to the output of the feedback LNA. Current passing through the resistor is determined at least in part by the gain of the feedback LNA and the value of the resistor. The amplified voltage signal is converted by the resistor into a current (without requiring a transconductor) and the current is input to the mixer. The current commuting mixer is coupled to the resistor and receives the current from the resistor.

Figure 1:
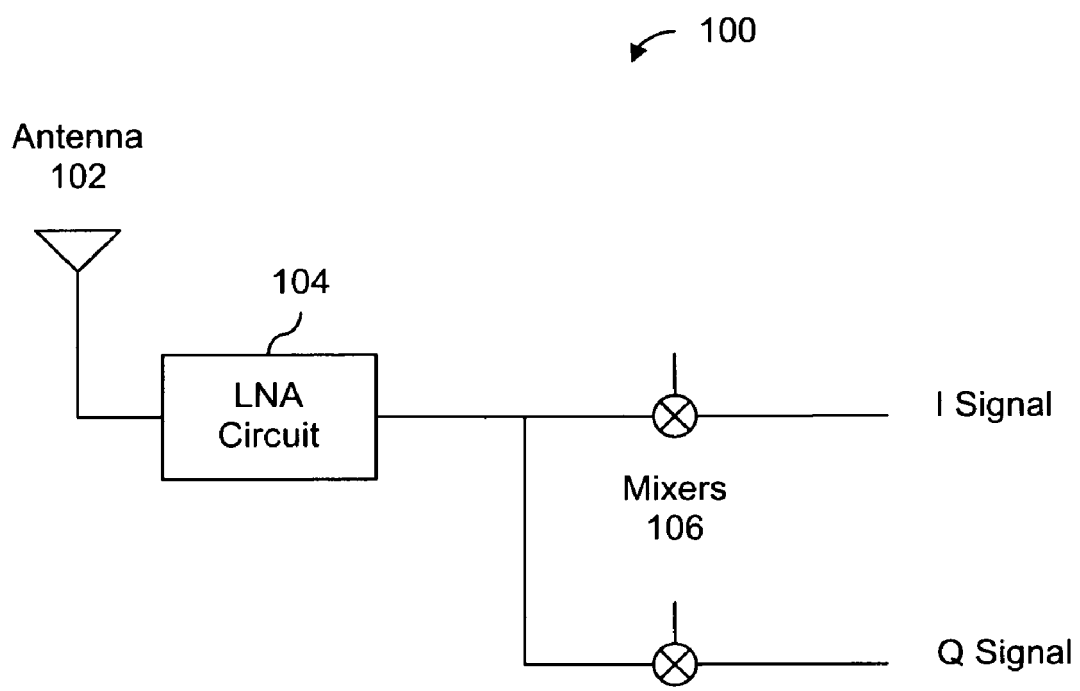
FIG. 1 is a system diagram illustrating an embodiment of a front end receiver.

FIG. 1 is a system diagram illustrating an embodiment of a front end receiver. In the example shown, front end receiver 100 shows the receive path of a wireless transceiver. A signal is received via antenna 102 and is passed to low noise amplifier (LNA) circuit 104. In some embodiments described herein, LNA circuit 104 includes a feedback LNA with a resistor. After amplification by LNA circuit 104, the amplified signal is passed to mixers 106, one of which outputs an I signal and the other of which outputs a Q signal. In this example, LNA circuit 104 outputs a current and passes the (amplified) current to mixers 106. Mixers 106 are current commuting mixers, such as a Gilbert multiplier.

In various embodiments, a variety of subsequent processing (e.g., I/Q correction, analog to digital conversion, etc.) is then performed. Front end receiver 100 is one example of a front end receiver and in other embodiments is configured differently (e.g., with different components and/or connections).

In various embodiments, LNA circuit 104 is configured to perform certain functions and/or have certain properties or attributes. In one example, LNA circuit 104 is impedence matched to antenna 102 so that the input resistance (Rin) of LNA circuit 104 is designed or configured to be 50Ω. In some cases, the input resistance varies with frequency and Rin is 50Ω at a frequency (range) of interest. In some embodiments, LNA circuit 104 is configured to have an overall gain from the input to output of LNA. In some cases, the overall gain is on the order of 10 to 20 dB. In some embodiments, LNA circuit 104 is configured to have low noise (e.g., on the order of 2 dB) and have good linearity.

In various embodiments, front end receiver is used in various applications. In one example, front end receiver 100 used in a software defined radio application. For example, the I and Q signals output by front end receiver 100 (in some embodiments after analog to digital conversion) passed to a software interface where subsequent processing is performed on the signals using software (e.g., as opposed to specially designed application specific integrated circuits (ASICs), field programmable gate arrays (FPGAs), or other hardware). Based on the frequency (range) of interest, front end receiver 100 is configured accordingly. For example, in GSM a channel is 200 KHz wide, in W-CDMA a channel is 3.8 MHz wide, and in LTE a channel is 20 MHz wide with various center frequencies of interest.

Figure 2:
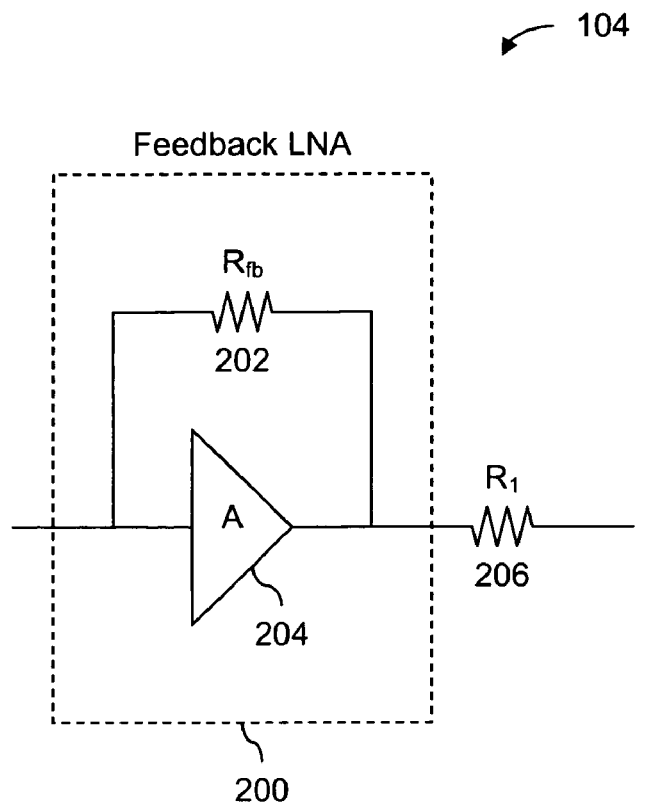
FIG. 2 is a diagram illustrating an embodiment of an LNA circuit that includes a feedback LNA and a resistor.
Figure 2:
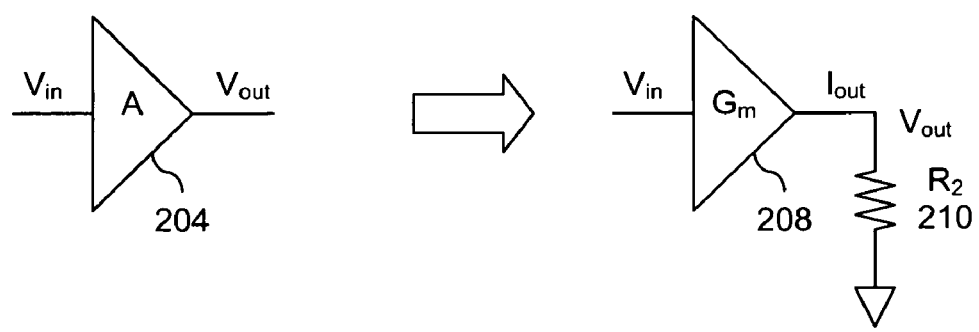

FIG. 2 is a diagram illustrating an embodiment of an LNA circuit that includes a feedback LNA and a resistor. In this example, LNA circuit 104 of FIG. 1 is implemented as shown. In some other embodiments, LNA circuit 104 is implemented differently. In this example of LNA circuit 104, the output of feedback LNA 200 is connected in series to' resistor R1 (206). In some embodiments, the value of R1 is approximately 500Ω-1 kΩ. Feedback LNA 200 includes gain element 204 and resistor 202. In various embodiments, gain element 204 is implemented as an op amp, with transistors, etc. The input of feedback LNA 200 is formed by connecting the input of gain element 204 and one end of resistor 202. The output of feedback LNA 200 is formed by connecting the other end of resistor 202 and the output of gain element 204. Gain element 204 has a broadband gain of A and resistor 202 has a resistance of Rfb. In some embodiments, resistor 202 has a value within the range of 500Ω-8 kΩ. Resistor 202 is sometimes referred to as a feedback resistor since it is in the feedback path. As used herein, a feedback LNA refers to any LNA that includes a feedback path.

Resistor 206 converts a voltage (which is output by feedback LNA 200) from a voltage to a current. The current output by LNA circuit 104 is (for example) passed on to a mixer (e.g., mixers 106 in FIG. 1). In some cases, resistor 206 or similar resistors are referred to as conversion resistors since this resistor converts a voltage to a current.

In some embodiments, some or all of the components included in LNA circuit 104 are adjustable. For example, the value of resistor 202 (Rfb) in some configurations is adjustable. Similarly, in some embodiments, the gain (A) of gain element 204 and/or resistor 206 is/are adjustable. In some embodiments, this allows a frequency of interest to be changed and/or for some or all parameters to be adjusted as desired (e.g., Rin, overall gain, noise, linearity, etc.).

Gain element 204 can conceptually be broken into or represent by two parts: a transconductor Gm (208), the output of which is coupled to the input of a resistor R2 (210). This is shown in FIG. 2. Gain element 204 has a voltage in (Vin) and a voltage out (Vout) whereas transconductor 208 has a voltage in (Vin) and a current out (Iout). The current output by transconductor 208 passes through resistor 210, creating an output voltage (Vout).

Any LNA circuit has various parameters which are of interest to circuit designers. The particular parameters of interest and/or desired parameter values vary from application to application. Some parameters of feedback LNA 200 are described in further detail below.

The input resistance (Rin) of feedback LNA 200 is given by the equation: Rin=Rfb/A+1/Gm. In some applications (including this example), the input resistance is dominated by Rfb/A (as opposed to 1/Gm) and Rin Rfb/A. In some other applications this is not the case and the appropriate equation for Rin is used depending upon the situation. In some embodiments, the input resistance is set to a value of 50Ω to match the impedance of the antenna (e.g., antenna 102 in FIG. 1). In some other embodiments, the input resistance is set to some other value.

The noise of feedback LNA 200 is proportional to 1/Gm. The noise of LNA circuit 104 shown in this figure is R1/A. In some embodiments, a desired noise ceiling is selected and the value of R1 and/or A is set accordingly. In one example, a desired noise ceiling is around 2 dB.

The overall gain (Vout/Iin) of feedback LNA 200 is approximated by Vout/Iin≈Rfb, where Iin is a current at the input of feedback LNA 200 and Vout is the voltage at the output of feedback LNA 200.

The output resistance (Rout) of feedback LNA 200 is given by Rout=1/Gm at low frequencies and approaches the feedback resistance (Rfb) at high frequencies.

Inspection of the parameter equations described above reveals that as the resistance of Rfb increases, the gain of the feedback LNA (i.e., Vout/Iin) increases. Another parameter that also increases with Rfb is Rin (which is undesirable). The input resistance (Rin) should be 50Ω to match the antenna impedance. To counteract this and keep the input impedance Rin at 50 Ω(or alternatively whatever Rin is desired), A is correspondingly increased (e.g., at the same rate) to keep Rin at a desirable value while still increasing Vout/Iin.

An attractive feature about the feedback LNA and resistor combination shown in this figure is that parameters (e.g., Rin, overall gain Vout/Iin, noise, etc.) can be set relatively easily without adversely affecting another parameter. Some other LNA circuits do not necessary have this ability and it can be difficult to optimize multiple parameters.

Another attractive feature of the example circuit shown is that power consumption can be controlled. The amount of current passing through the circuit (and thus the power consumed) is dependent upon the value of R1 (resistor 206).

Another attractive feature about the circuit shown in this figure is that all or almost all of the components are passive. Other less attractive components such as transconductors are not used. Some other LNA circuits use a transconductor to do the voltage to current conversion (e.g., instead of resistor 206). One benefit to using resistor 206 (e.g., compared to a transconductor) is that a resistor has better linearity performance. This is particularly attractive for applications where there are large swings in the signal in which linearity performance is more important. Resistor 206 is also desirable because no DC current is required for biasing (as compared to a transconductor) which reduces power consumption.

In some embodiments, a system includes components in addition to those shown in this example. For example, some configurations include a bypass capacitor in series with mixer R1 (i.e., resistor 206).

Some other LNA circuits use on-chip inductors to perform impedance matching (e.g., to the resistance of an antenna). LNA circuit 104 is able to perform impedance matching without the use of on chip inductors which is attractive in certain applications. Using inductors in an LNA circuit "hard codes" the circuit to a particular frequency (range) of interest and the circuit cannot be reconfigured for other frequencies of interest. For example, an LNA would include small inductors for high frequency applications whereas large inductors would be used for low frequency applications. In some applications (e.g., in software defined radio) this is unattractive.

Feedback LNA 200 helps the linearity of a receiver which includes it (e.g., front end receiver 100 from FIG. 1) by mitigating non-linearity issues in a subsequent mixer (e.g., mixers 106 in FIG. 1). For example, using the Third Order Input Intercept Point (IIP3) as a measurement, using a feedback LNA increases the IIP3 value.

Other circuit designers have avoided using a resistor in series with an LNA (any LNA, not necessarily a feedback LNA) because of certain issues. A conversion resistor can cause certain LNA circuits to not operate as desired. A conversion resistor can load some existing LNA circuits, which reduces the gain (in some cases quite significantly). A conversion resistor also reduces the amount of rejection to a single transistor (as opposed to at least two transistors if a transconductor is used to do the voltage to current conversion). For example, with a resistor between some types of LNAs and a mixer, some noise from the oscillator connected to the mixer will feed back through the conversion resistor to the LNA. In general, an LNA with a high output impedance will not work with a conversion resistor. These issues do not occur with a transconductor to do the voltage to current conversion and therefore other circuits use a transconductor to do the voltage to current conversion.

Feedback LNA 200 in series with conversion resistor 206 does not have the issues described above. Feedback LNA 200 has a relatively small output impedance compared to some other LNA circuits and will work with a conversion resistor. Also, as shown by the equation for overall gain (Vout/Iin) above, the gain can be set to acceptable levels. A conversion resistor is a passive component and the linearity properties are quite good. Optimizing the linearity of feedback LNA 200 and/or a subsequent mixer can then be focused on without having to worry about the linearity of resistor 206.

Figure 3:
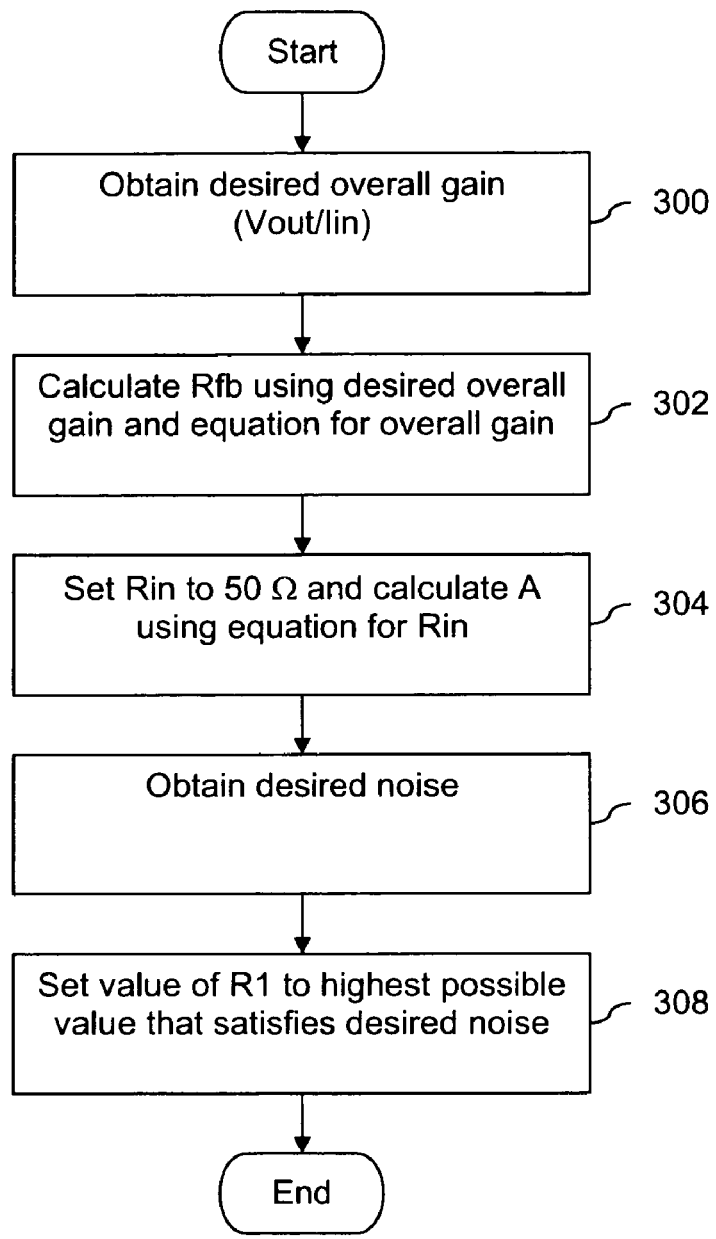
FIG. 3 is a flowchart illustrating an embodiment of a process for selecting component values for a circuit that includes a feedback LNA and a resistor.

FIG. 3 is a flowchart illustrating an embodiment of a process for selecting component values for a circuit that includes a feedback LNA and a resistor. The example process corresponds to the LNA circuit shown in FIG. 2. Other configurations have different equations (e.g., for Rin, Vout/Iin, etc.) and the process to set the parameters may be different.

At 300, a desired overall gain (Vout/Iin) is obtained. At 302, Rfb is calculated using the desired overall gain and equation for overall gain. In this example, Vout/Iin≈Rfb. In some cases, Rfb is between 500Ω and 8 kΩ. At 304, Rin is set to 50Ω and A is calculated using the equation for Rin. In this example, Rin≈Rfb/A. At 306, a desired noise is obtained. For example, the desired noise value may be ~2 dB. The value of R1 is set to highest possible value that satisfies the desired noise at 308. In this example, noise=R1/A. By setting R1 to the highest possible value, power consumption is reduced (since increasing the value of R1 causes power consumption to decrease) while still satisfying the noise requirement. Another benefit to increasing the value of R1 is the mixer (e.g., mixer 106 in FIG. 1) has better protection since less current is going through it. In some cases, R1 is between 500Ω and 1 kΩ.

Figure 4:
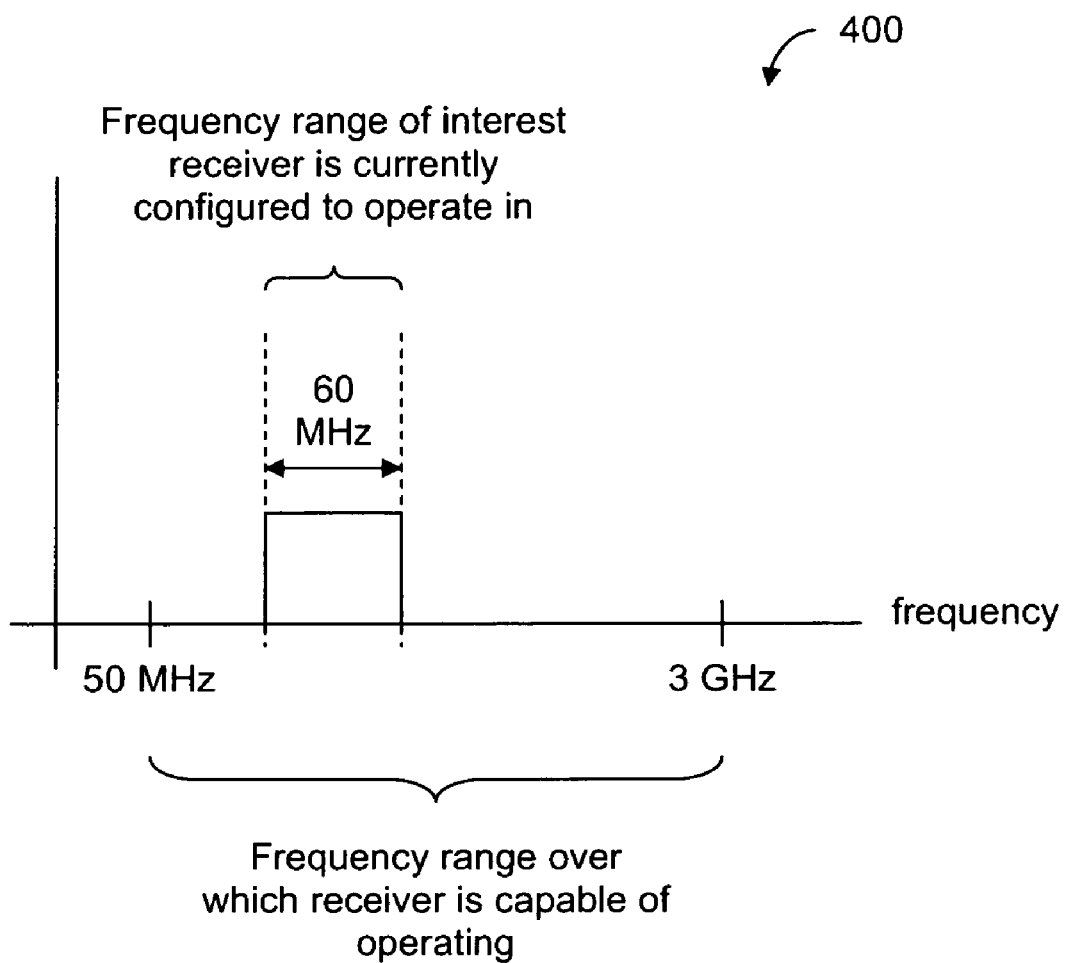
FIG. 4 is a frequency spectrum illustrating an example of a broadband application.

FIG. 4 is a frequency spectrum illustrating an example of a broadband application. In some embodiments, a receiver (e.g., LNA circuit 104 shown in FIG. 2) is a broadband circuit. As used herein, the term broadband refers to a relatively wide operating frequency range. In frequency spectrum 400, the range over which the receiver is capable of operating is from 50 MHz to 3 GHz. The term broadband does not necessarily mean that a device operates in the entire possible range at the same time. In this particular example, the receiver is currently configured to operate in a 60 MHz wide band within 50 MHz to 3 GHz. In some embodiments, a broadband receiver is configurable (e.g., so that the width and/or positioning of a frequency range of interest can be adjusted as desired).

One issue in developing a feedback LNA with a resistor (e.g., LNA circuit 104 shown in FIG. 2) is the difficulty in maintaining a relatively constant Rin over a desired operational frequency range (e.g., 50 MHz to 3 GHz). Although some other feedback LNAs exist, many of them have an Rin that begins to increase at frequencies that are too low to be useful. For example, some existing LNAs have Rin values that begin to increase in the MHz range. For broadband applications, it would preferable if Rin were (relatively) constant (e.g., at 50Ω) until the GHz range. One traditional solution to this problem is to use inductors. However, in at least some applications it is undesirable to use inductors and a solution that does not use inductors would be desirable.

The following figures show some examples of feedback LNA circuits that overcome the issues described above.

Figure 5:
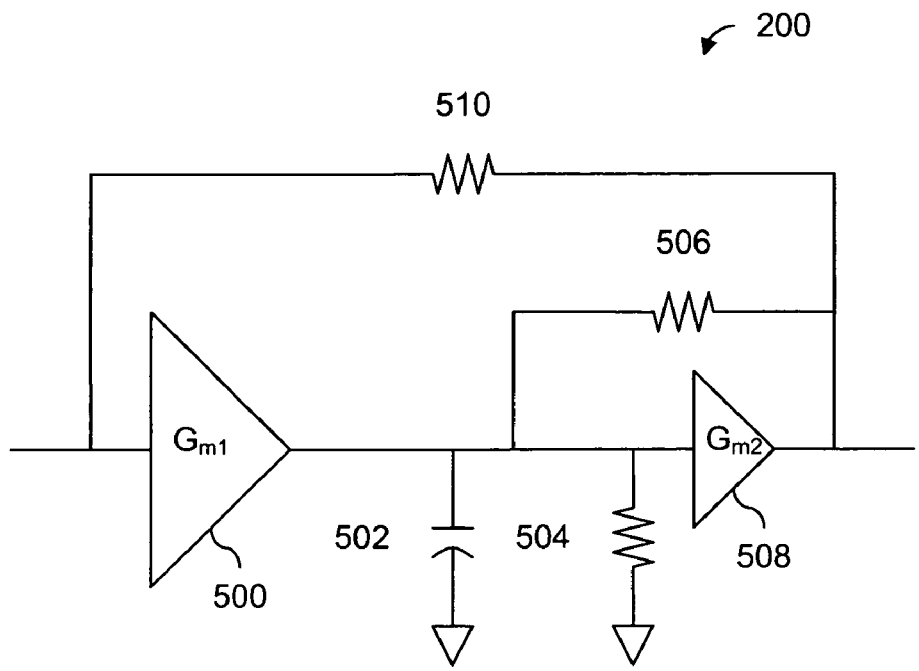
FIG. 5 shows an example of a feedback LNA circuit with a resistor that has a desirable Rin frequency response.
Figure 5:
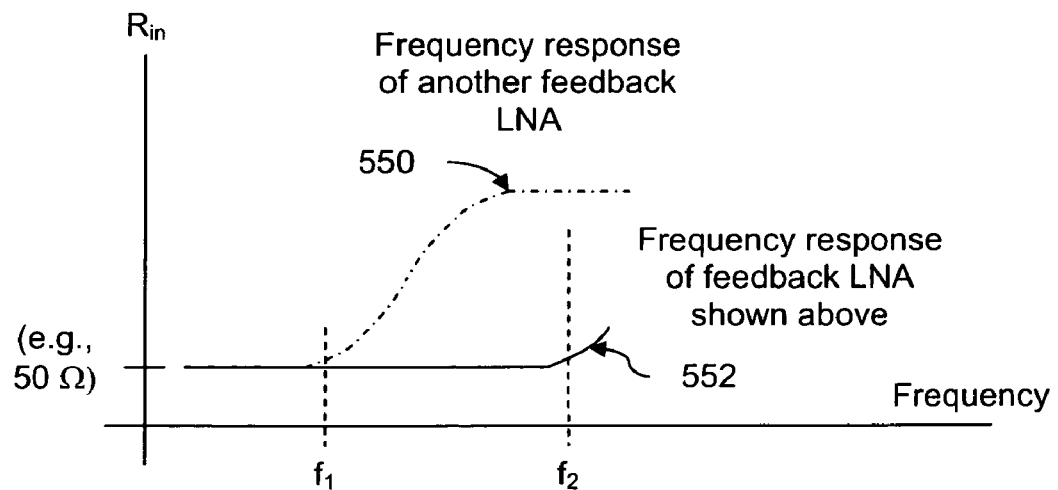

FIG. 5 shows an example of a feedback LNA circuit with a resistor that has a desirable Rin frequency response. In this example, feedback LNA 200 of FIG. 2 is implemented as the circuit shown in this figure. In some other embodiments, feedback LNA 200 is configured differently. In this example, the output of a first transconductor (500) is coupled to a capacitor (502) to ground, a resistor (504) to ground, one end of another resistor (506), and the input of a second transconductor (508). The output of the second transconductor (508) and the other end of resistor 506 are coupled together, as well as to a third resistor (510). The other end of the third resistor (510) is coupled to the input of the first transconductor (500). The Gm2 value of the second transconductor (508) is smaller than the Gm1 value of the first transconductor (500) in this particular example.

Compared to some other feedback LNA circuits, the circuit shown in this figure has a higher corner frequency at which Rin begins to increase. FIG. 5 shows the frequency response of Rin for the LNA circuit shown in this figure and for another LNA circuit (not shown). Dashed and dotted line 550 shows a frequency response for Rin of another feedback LNA circuit. At the corner frequency f1, the input resistance Rin begins to increase. In some cases, f1 is on the order of a few MHz which is too low for a broadband application.

Solid line 552 shows the frequency response of Rin for the feedback LNA shown in this figure. The corner frequency (f2) at which Rin begins to increase is larger than f1. The frequency f2 is technology dependent. In some cases, f2 is approximately 1 GHz. In some other cases, f2 is approximately 6 GHz.

The feedback LNA circuit shown in this figure is described in U.S. Pat. No. 7,312,659 by Farbod Aram entitled MULTI-AMPLIFIER CIRCUIT which is incorporated herein by reference for all purposes.

Figure 6:
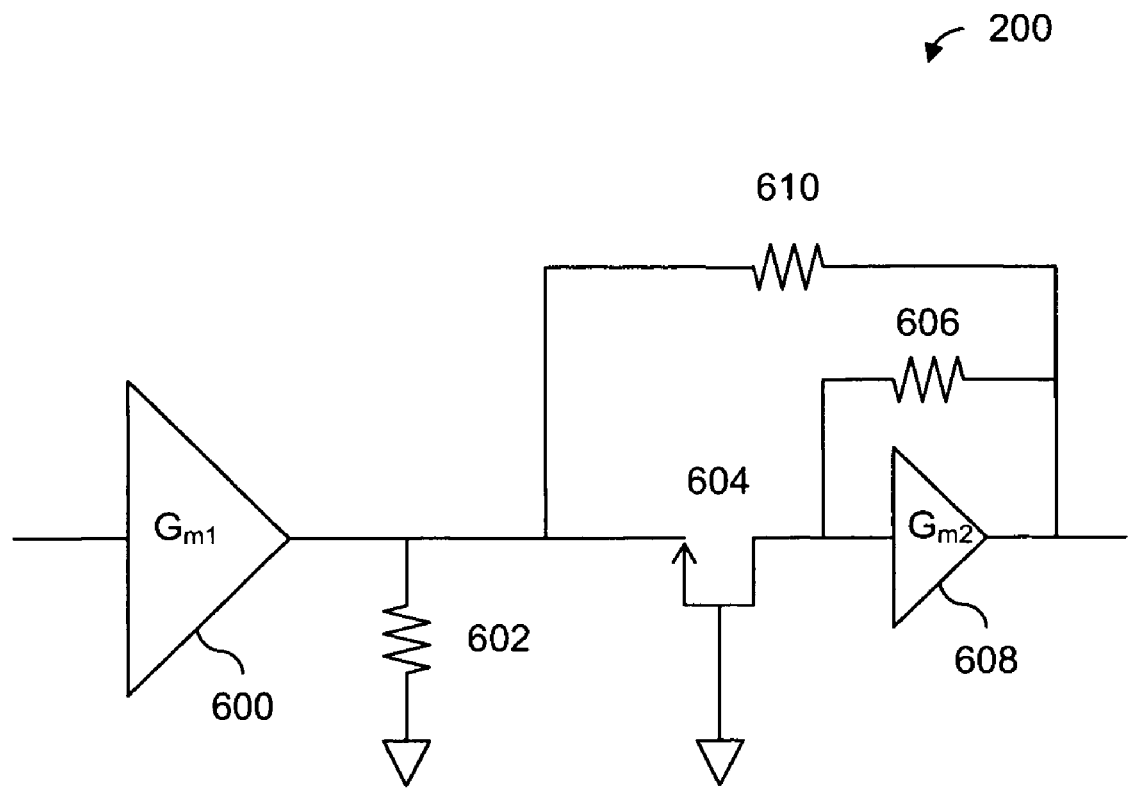
FIG. 6 shows an example of an LNA circuit having a common gate transistor with a desirable Rin frequency response.

FIG. 6 shows an example of an LNA circuit having a common gate transistor with a desirable Rin frequency response. In this example, feedback LNA 200 of FIG. 2 is implemented as the circuit shown in this figure. In some other embodiments, feedback LNA 200 is configured differently. In this example, the feedback LNA includes a first transconductor (600), the output of which is coupled to a resistor to ground (602), the source of a common gate transistor (604), and a second resistor (610). The drain of common gate transistor 604 is connected to a third resistor (606) and the input of a second transconductor (608). The output of the second transconductor 608 is connected to the other end of the third resistor (606), as well as the other side of the second resistor (610).

The circuit shown in FIG. 6 consumes less power than the circuit shown in FIG. 5 and is able to operate over a larger frequency range. In some applications (e.g., wireless or other applications with a battery or software defined radio), this is attractive.

The LNA circuit shown in this figure is described in U.S. Publication No. 2008/0079494 by Aram et al. entitled BROADBAND LOW NOISE AMPLIFIER which is incorporated herein by reference for all purposes.

FIGS. 5 and 6 show some examples of feedback LNA circuits used to implement feedback LNA 200 in FIG. 2. Any appropriate feedback LNA can be used and in some other embodiments feedback LNA 200 is implemented in some other manner than the examples shown here.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A receiver comprising:
   a feedback low noise amplifier (LNA), having an LNA gain, and including:
      an LNA input configured to receive a signal from an antenna; and
      an LNA output configured to output an amplified voltage signal;
   a resistive element, having a resistance, coupled to the LNA output and configured to convert the amplified voltage signal into a current; and
   a current commuting mixer coupled to the resistive element and configured to receive the current from the resistive element, wherein the current output by the resistive element is to determined at least in part by the amplified voltage signal and the resistance of the resistive element.

2. The receiver of claim 1, wherein the resistance of the resistive element is substantially within the range of 500Ω to 1 kΩ.

3. The receiver of claim 1, wherein the feedback LNA further includes:
   a feedback resistor with a resistance of Rfb; and
   a gain element with a gain of A, wherein a first end of the feedback resistor is coupled to the output of the gain element and a second end of the feedback resistor is coupled to the input of the gain element.

4. The receiver of claim 3, wherein Rfb is substantially within the range of 500Ω to 8 kΩ.

5. The receiver of claim 3, wherein the feedback resistor has an adjustable resistance and/or the gain element has an adjustable gain.

6. The receiver of claim 3, wherein the input impedance of the feedback LNA is approximated by Rin≈Rfb/A.

7. The receiver of claim 6, wherein the input impedance of the feedback LNA is matched to the antenna.

8. The receiver of claim 1, wherein power consumed by the receiver decreases as the resistance of the resistive element increases.

9. The receiver of claim 1, wherein the feedback LNA includes:
   a first transconductor having a gain of Gm1 and a second transconductor having a gain of Gm2;
   a first resistor connected to ground, a second resistor, and a third resistor; and
   a capacitor connected to ground, wherein:
      the output of the first transconductor is connected to the capacitor, the first resistor, the input of the second transconductor, and a first end of the second resistor;
      the output of the second transconductor is connected to a second end of the second resistor and a first end of the third resistor; and
      a second end of the third resistor is connected to the input of the first transconductor.

10. The receiver of claim 9, wherein Gm1 is strictly greater than Gm2.

11. The receiver of claim 1, wherein the feedback LNA includes:
    a first transconductor having a gain of Gm1 and a second transconductor having a gain of Gm2;
    a first resistor connected to ground, a second resistor, and a third resistor; and
    a common gate transistor, wherein:
       the output of the first transconductor is connected to the first resistor, a first end of the third resistor, and the source of the common gate transistor;
       the drain of the common gate transistor is connected to a first end of the second resistor, and the input of the second transconductor; and
       the output of the second transconductor is connected to a second end of the second transistor and a second end of the third transistor.

12. The receiver of claim 11, wherein Gm1 is strictly greater than Gm2.

13. A method comprising:
    receiving a signal from an antenna;
    amplifying the received signal using a feedback low noise amplifier (LNA) to generate an amplified voltage signal;
    converting the amplified voltage signal into a current using a resistive element, having a resistance, wherein the current is determined at least in part by the amplified voltage signal and the resistance of the resistive element; and
    outputting the current to a current commuting mixer.

14. The method of claim 13, wherein the feedback LNA includes:
    a feedback resistor with a resistance of Rfb; and
    a gain element with a gain of A, wherein a first end of the feedback resistor is coupled to the output of the gain element and a second end of the feedback resistor is coupled to the input of the gain element.

15. The method of claim 14, wherein the feedback resistor has an adjustable resistance and/or the gain element has an adjustable gain.

16. The method of claim 14, wherein the input impedance of the feedback LNA is approximated by Rin≈Rfb/A.

17. The method of claim 16, wherein the input impedance of the feedback LNA is matched to the antenna.

18. The method of claim 13, wherein power consumed by the receiver decreases as the resistance of the resistive element increases.

19. The method of claim 13, wherein the feedback LNA includes:
    a first transconductor having a gain of Gm1 and a second transconductor having a gain of Gm2;
    a first resistor connected to ground, a second resistor, and a third resistor; and
    a capacitor connected to ground, wherein:
       the output of the first transconductor is connected to the capacitor, the first resistor, the input of the second transconductor, and a first end of the second resistor;
       the output of the second transconductor is connected to a second end of the second resistor and a first end of the third resistor; and
       a second end of the third resistor is connected to the input of the first transconductor.

20. The method of claim 13, wherein the feedback LNA includes:
    a first transconductor having a gain of Gm1 and a second transconductor having a gain of Gm2;
    a first resistor connected to ground, a second resistor, and a third resistor; and
    a common gate transistor, wherein:

the output of the first transconductor is connected to the first resistor, a first end of the third resistor, and the source of the common gate transistor;

the drain of the common gate transistor is connected to a first end of the second resistor, and the input of the second transconductor; and the output of the second transconductor is connected to a second end of the second transistor and a second end of the third transistor.

* * * * *